United States Patent
Harada et al.

(10) Patent No.: US 7,750,411 B2
(45) Date of Patent: Jul. 6, 2010

(54) SEMICONDUCTOR INTEGRATED CIRCUIT DEVICE

(75) Inventors: Hirofumi Harada, Chiba (JP); Hisashi Hasegawa, Chiba (JP); Hideo Yoshino, Chiba (JP)

(73) Assignee: Seiko Instruments Inc., Chiba (JP)

( * ) Notice: Subject to any disclaimer, the term of this patent is extended or adjusted under 35 U.S.C. 154(b) by 101 days.

(21) Appl. No.: 11/823,273

(22) Filed: Jun. 26, 2007

(65) Prior Publication Data

US 2008/0006879 A1    Jan. 10, 2008

(30) Foreign Application Priority Data

Jun. 27, 2006  (JP)  ............... 2006-176107

(51) Int. Cl.
*H01L 29/94*   (2006.01)
(52) U.S. Cl. .............. 257/369; 257/336; 257/338; 257/339; 257/344; 257/E2.435; 257/E27.064
(58) Field of Classification Search ............. 257/368, 257/369, E29, 336, 338, 339, 344, E2.435, 257/E27.064
See application file for complete search history.

(56) References Cited

U.S. PATENT DOCUMENTS

| 5,834,352 | A | * | 11/1998 | Choi | ..................... 438/275 |
| 6,525,376 | B1 | | 2/2003 | Harada et al. | |
| 6,720,633 | B2 | | 4/2004 | Harada et al. | |

FOREIGN PATENT DOCUMENTS

JP    6-350084 A    12/1994

* cited by examiner

*Primary Examiner*—Tan N Tran
(74) *Attorney, Agent, or Firm*—Brinks Hofer Gilson & Lione

(57) ABSTRACT

Provided is a semiconductor integrated circuit device, which includes: a low-voltage MOS transistor having a source/drain region formed of a low impurity concentration region and a high impurity concentration region; and a high-voltage MOS transistor similarly having a source/drain region formed of a low impurity concentration region and a high impurity concentration region, in which, the source/drain high impurity concentration region of the low-voltage NMOS transistor is doped with arsenic, while the source/drain high impurity concentration region of the high-voltage NMOS transistor is doped with phosphorus.

12 Claims, 4 Drawing Sheets

Prior Art

Prior Art

SEMICONDUCTOR INTEGRATED CIRCUIT DEVICE

This application claims priority under 35 U.S.C. §119 to Japanese Patent Application No. JP2006-176107 filed Jun. 27, 2006, the entire content of which is hereby incorporated by reference.

BACKGROUND OF THE INVENTION

1. Field of the Invention

The present invention relates to a semiconductor integrated circuit device which includes an N-channel type low-voltage MOS transistor and an N-channel type high-voltage MOS transistor.

2. Description of the Related Art

In a semiconductor integrated circuit a low-voltage element and a high-voltage element are both used, depending on the respective use thereof. For example, a high-voltage element is used only in a section which directly handles a voltage applied to and sent from the semiconductor integrated circuit, while a low-voltage element is used in a section which performs internal signal processing. The low-voltage element occupies a smaller area than the high-voltage element. Accordingly, the use of the high-voltage element only in a section which determines the performance specification of the integrated circuit and is difficult to modify, such as a section relating to voltages exchanged with outside, and the use of the low-voltage element in a section for performing the internal processing permit the reduction in the area of the semiconductor integrated circuit and the manufacturing cost thereof.

FIG. 2 is a schematic plan view of the above-mentioned low-voltage MOS transistor and the high-voltage MOS transistor formed on the same substrate and in the same semiconductor integrated circuit.

The low-voltage N-channel MOS transistor (hereinafter, referred to as NMOS) 101 includes a gate insulating film 8, a gate electrode 9 disposed directly above the gate insulating film 8, and a source/drain region provided on both ends thereof. The source/drain region includes the first N-type high impurity concentration region 2 of low resistance for contacting metal, and the first N-type low impurity concentration region 3 for alleviating electric field intensity.

In this case, the first high concentration N-type region 2 in particular is doped with atoms of, for example, arsenic or antimony, which has a small diffusion coefficient and whose thermal diffusion is small. The reason for this is to avoid diffusion of the high impurity concentration in a lateral direction due to the heat treatment process performed during the semiconductor processing as much as possible, adversely resulting in reduction in length of the first N-type low impurity concentration region 3. The problem can be avoided by securing a predetermined length for the first N-type low impurity concentration region 3 if the first N-type low impurity concentration region 3 is designed to have an ample length so as to allow for the diffusion, which leads to, however, an increase in an area to be occupied by the element to thereby increase cost.

Meanwhile, the high-voltage NMOS 102 includes the gate insulating film 8, the gate electrode 9 disposed directly above the gate insulating film 8, and a source/drain region provided on both ends thereof. The source/drain region includes the second N-type high impurity concentration region 4 and a second N-type low impurity concentration region 5, and the high-voltage NMOS 102 further includes an oxide film 10 formed on the second N-type low impurity concentration region 5, the oxide film 10 being thicker than the gate insulating film 8. The thick oxide film 10 has an effect of alleviating the gate-drain electric field intensity. The above-mentioned drain structure is adapted to a case where the drain needs to be resistant to a voltage of 20 V or more, and a withstanding voltage is adjusted by varying the length and the concentration of the N-type low impurity concentration region of the drain. Further, in a case where the gate of the high-voltage NMOS 102 is also applied with a voltage which is larger than the voltage applied to the low-voltage NMOS 101, the thickness of the gate insulating film 8 may be increased only for the portion corresponding to the high-voltage NMOS 102 according to the voltage.

The second N-type high impurity concentration region 4 of the high-voltage NMOS 102 is generally formed through the same process for forming the N-type highly-concentrated impurity region 2 of the low-voltage NMOS 101 for the purpose of reducing process cost, and arsenic or antimony is used as the impurity to be implanted therein.

Also, the second low impurity concentration region 4 is often used in combination with a channel stop structure provided outside of the element region, thereby reducing process cost. The second low impurity concentration region 4 accordingly has an oxide film obtained through the LOCOS process disposed thereon, and the concentration of the second low impurity concentration region 4 is adjusted to a value that is not inverted due to the wiring. In general, in a case where the high-voltage NMOS is less frequently used in the semiconductor integrated circuit, limitations are imposed on the high-voltage NMOS in terms of structure for reducing cost as described above, and the element has to be designed under the limiting conditions.

Further, there may be provided a third N-type low impurity concentration region 7 to the depth of several µm on the drain side of the high-voltage NMOS 102, in such a manner that the third N-type low impurity concentration region 7 covers the entire N-type high impurity concentration region 4 and a part of the N-type low impurity concentration region 5. The third N-type low impurity concentration region 7 is provided so as to complement a small contact area between the N-type low impurity concentration region 5 and the N-type high impurity concentration region 4 on the drain side shown in FIG. 3A, which produces an effect of preventing a thermal destruction from being caused by a high electric field and a large current to be applied when the high-voltage NMOS 102 electrically operates. The thermal destruction phenomenon described above not only results in an instant destruction but also affects the long-term reliability.

In order to form the N-type low impurity concentration region 7, the region needs to be doped with an impurity, such as phosphorus, which has a high diffusion coefficient and is easy to thermally diffuse, and also needs to be subjected to high-heat processing with a temperature of 1,000° C. or more in order to attain a certain predetermined diffusion depth.

The above-mentioned structure of the high-voltage NMOS is disclosed in JP 06-350084 A and in JP 3270405 B.

In the conventional high-voltage NMOS, it is necessary to provide a deep N-type impurity region covering the entire N-type high impurity concentration region and a part of the N-type low impurity concentration region, and the formation of the region additionally involves a heat treatment process, which results in the limitation of the performance of the element, and a photolithography process, which leads to an increase in cost. On the other hand, if the deep N-type impurity region is not provided, there has been a problem that a breakdown withstanding voltage is not sufficiently attained and a long-term reliability is impaired.

SUMMARY OF THE INVENTION

The present invention has been made to solve the above-mentioned problems, and provides a semiconductor integrated circuit device, including an N-channel type low-voltage MOS transistor and an N-channel type high-voltage MOS transistor which are formed on a semiconductor substrate, the N-channel type low-voltage MOS transistor including: a gate insulating film; a gate electrode; and a source/drain region which is formed of a first N-type high impurity concentration region and a first N-type low impurity concentration region formed between the gate insulating film and the first high impurity concentration region, the N-channel type high-voltage MOS transistor including: a gate insulating film; a gate electrode; a second source/drain region which is formed of a second N-type high impurity concentration region and a second N-type low impurity concentration region formed between the gate insulating film and the second high impurity concentration region; and an insulating film formed on the second low impurity concentration region, the insulating film being thicker than the gate insulating film, in which the first high impurity concentration region is doped with arsenic and the second high impurity concentration region is doped with phosphorus.

The present invention also provides a semiconductor integrated circuit device, including: a first N-channel type low-voltage MOS transistor; an N-channel type high-voltage MOS transistor; and a second N-channel type low-voltage MOS transistor, which are formed on a semiconductor substrate, the first N-channel type low-voltage MOS transistor including: a gate insulating film; a gate electrode; and a source/drain region which is formed of a first N-type high impurity concentration region and a first N-type low impurity concentration region formed between the gate insulating film and the first high impurity concentration region, the N-channel type high-voltage MOS transistor including: a gate insulating film; a gate electrode; a second source/drain region which is formed of a second N-type high impurity concentration region and a second N-type low impurity concentration region formed between the gate insulating film and the second high impurity concentration region; and an insulating film formed on the second low impurity concentration region, the insulating film being thicker than the gate insulating film, the second N-channel type low-voltage MOS transistor including: a gate insulating film formed on the semiconductor substrate; a gate electrode; and a source/drain region formed of a third high impurity concentration region, in which the first high impurity concentration region is doped with arsenic, and the second high impurity concentration region and the third high impurity concentration region are each doped with phosphorus.

Also, in the semiconductor integrated circuit device, the first high impurity concentration region is doped with antimony, and the second high impurity concentration region is doped with phosphorus.

Also, in the semiconductor integrated circuit device, the first high impurity concentration region is doped with antimony, and the second and third high impurity concentration regions are each doped with phosphorus.

Further, in the semiconductor integrated circuit device, the second high impurity concentration region has an impurity concentration of $1 \times 10^{19}/cm^3$ or more and has a depth of 0.5 μm or more; and the second N-type low impurity concentration region has an impurity concentration between $1 \times 10^{17}$ to $5 \times 10^{17}$ $cm^3$ and has a depth of 0.3 μm or less.

Further, in the semiconductor integrated circuit device, the first high impurity concentration region and the second low impurity concentration region contact over an area of 0.2 μm or more in thickness.

According to the present invention, it is possible to provide a semiconductor integrated circuit device having a reliable high-voltage NMOS, which is less likely subject to change in element size and performance deterioration due to an increase in the number of process steps and high-heat processing while having a high-withstanding voltage.

DETAILED DESCRIPTION OF THE PREFERRED EMBODIMENTS

Figure 1:
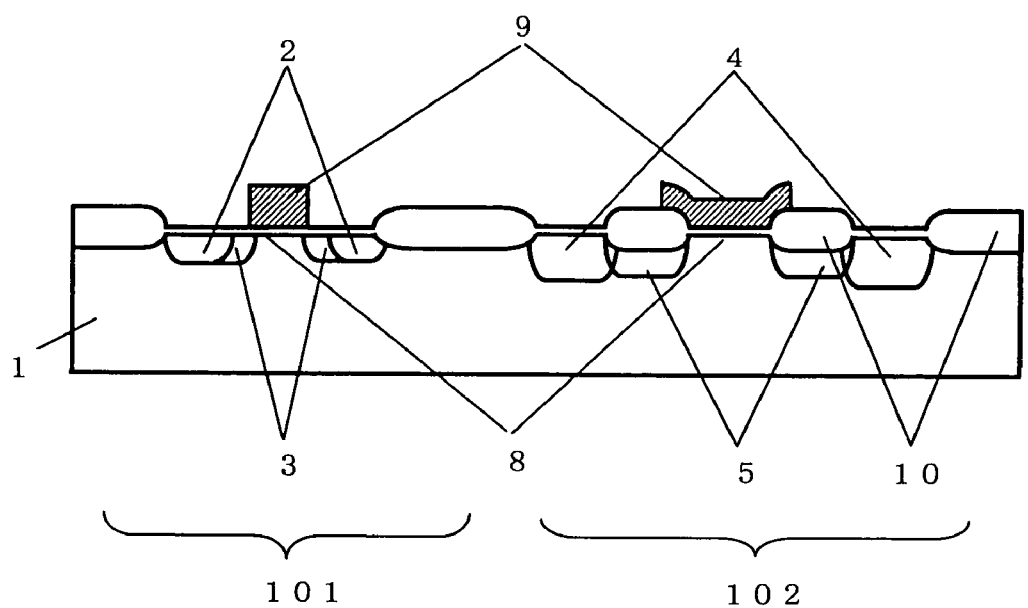
FIG. 1 is a schematic cross-sectional view showing a semiconductor integrated circuit device according to the present invention.
Figure 2:
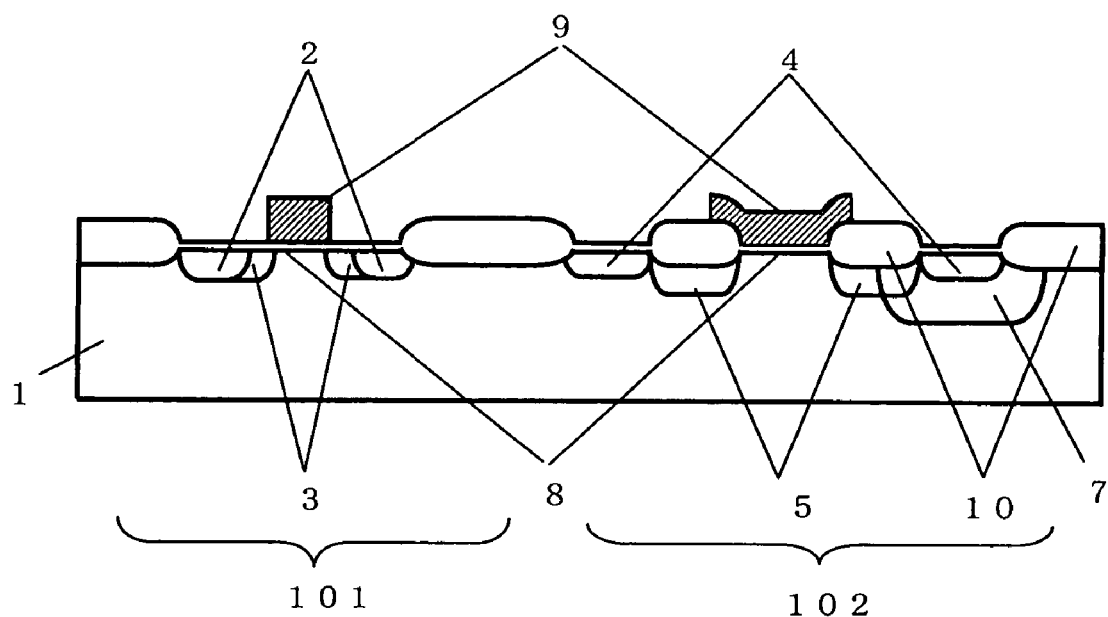
FIG. 2 is a schematic plan view showing a conventional semiconductor integrated circuit device.

Hereinbelow, an embodiment of the present invention is described with reference to the accompanying drawings. FIG. 1 is a schematic cross-sectional view of the semiconductor integrated circuit device according to the present invention, in which a low-voltage NMOS and a high-voltage NMOS are integrated on a single semiconductor substrate 1. According to the present invention, the high-voltage NMOS is not provided with the third N-type low impurity concentration region used in the conventional example. In stead of providing the third N-type low impurity concentration region, the second high impurity concentration region 4 of the high-voltage NMOS is formed to be thicker in depth and wider in a lateral direction as compared with the conventional structure. With this structure, the second N-type high impurity concentration region and the second N-type low impurity concentration region come into contact with each other over a large area in depth, to thereby prevent a thermal breakdown when applied with a high electric field and operated with a high current. The thermal breakdown becomes more noticeable when the above-mentioned contact area reduces to be less than 0.2 μm in depth. Accordingly, the present invention adopts the following methods in order to secure the depth of the contact area.

According to a first one of the methods, the second N-type high impurity concentration region of high-voltage NMOS is doped with phosphorus of high diffusion coefficient, while the first N-type high impurity concentration region is doped with, as in the conventional case, the atoms of, for example, arsenic or antimony, which has a low diffusion coefficient.

Figure 3A:
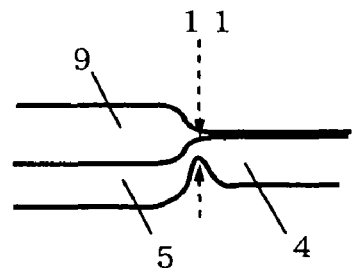
FIG. 3A is a schematic cross-sectional view showing a main part of the conventional semiconductor integrated circuit device.
Figure 3B:
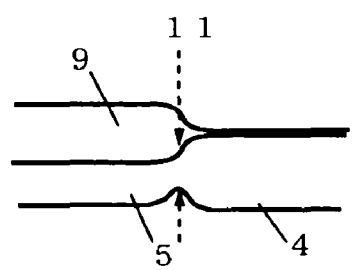
FIG. 3B is a schematic cross-sectional view showing a main part of the semiconductor integrated circuit device according to the present invention.

FIGS. 3A and 3B each are a cross-sectional view of a main part of the semiconductor integrated circuit device for illustrating the relation between the high impurity concentration region and the low impurity concentration region described above. FIG. 3A shows a junction formed in the conventional case where the high impurity concentration region doped with an impurity of low diffusion coefficient is adopted, which illustrates that the low impurity concentration region and the high impurity concentration region contact with each other over a small area in depth. In contrast to this, when the high impurity concentration region is doped with atoms of high diffusion coefficient, the high impurity concentration is more likely to diffuse in a lateral direction as shown in FIG. 3B, to thereby increase the depth of the contact area.

For example, in the high-voltage NMOS structure of FIG. 1, in the case where the low-impurity concentration region is doped with phosphorus in concentration between $1 \times 10^{17}$ and $5 \times 10^{17}/cm^3$ and is formed to be 0.3 μm in depth, phosphorous is adopted as the high impurity concentration to be implanted in the source/drain region of the high-voltage NMOS in concentration of $1 \times 10^{19}/cm^3$ or more, to thereby obtain the high impurity concentration region of 0.5 μm in depth. In this case, the low impurity concentration region and the high impurity concentration region described above can come into contact with each other over an area of 0.2 μm in depth, though depending on the heat treatment process to be applied thereto.

The depth of the contact area may be increased by means of increasing the diffusion of the low impurity concentration in a lateral direction, instead of increasing the diffusion of the high impurity concentration in a lateral direction, which is not preferable in terms of reducing cost as described later.

The low impurity concentration region of the high-voltage NMOS of FIG. 1 also serves as an element separation region in terms of structure, for the purpose of reducing the number of process steps. In order to further reduce an area necessary for the entire semiconductor integrated circuit so as to contribute to cost reduction, it is effective to set the low-voltage condition for the element separation region. This particularly produces a larger effect as the low-voltage NMOS accounts for a larger area in the semiconductor integrated circuit. In this case, the concentration of the low impurity concentration region is inevitably set to a low value on the low-voltage side. For this reason, it is not possible to expect the diffusion of the impurity in a lateral direction on the low impurity concentration region side without increasing the number of the process steps, and hence the lateral diffusion of the high impurity concentration region, rather than the low impurity concentration region, is inevitably desired in the high-voltage NMOS.

In the case of pursuing the reduction of cost as described above, it is generally more effective to reduce the low-voltage NMOS in size, which is mainly used in a logical circuit, so as to produce a larger effect on an area reduction, and it is also preferable that the withstanding voltage of the low-voltage NMOS be set to be small in itself. Accordingly, it is also necessary, along with the above, to set the concentration of the low impurity concentration region of the element separation region to be low. The depth of the contact area between the low impurity concentration region and the high impurity concentration region can be secured without any significant problem, provided that the concentration of the low impurity concentration region is equal to or larger than $1 \times 10^{18}/cm^3$. However, the concentration cannot be practically set to $1 \times 10^{18}/cm^3$ in view of reducing an area, and it is reasonable to provide a condition with the concentration set between $1 \times 10^{17}$ to $5 \times 10^{17}/cm^3$. In other words, it is understood that the present invention is suited for reducing cost as described above and provides a technology capable of simultaneously integrating the low-voltage NMOS and the high-voltage NMOS, to thereby produce a most prominent effect even in the case of pursuing cost reduction by reducing, for example, the number of process steps and the area.

In this example, the high impurity concentration region needs to be doped with the different impurities depending on the withstanding voltage of the element, which may lead to an increase in process cost because a photolithography process needs to be additionally involved. Actually, however, it is possible to solve the problem with the structure shown in FIG. 4.

Figure 4:
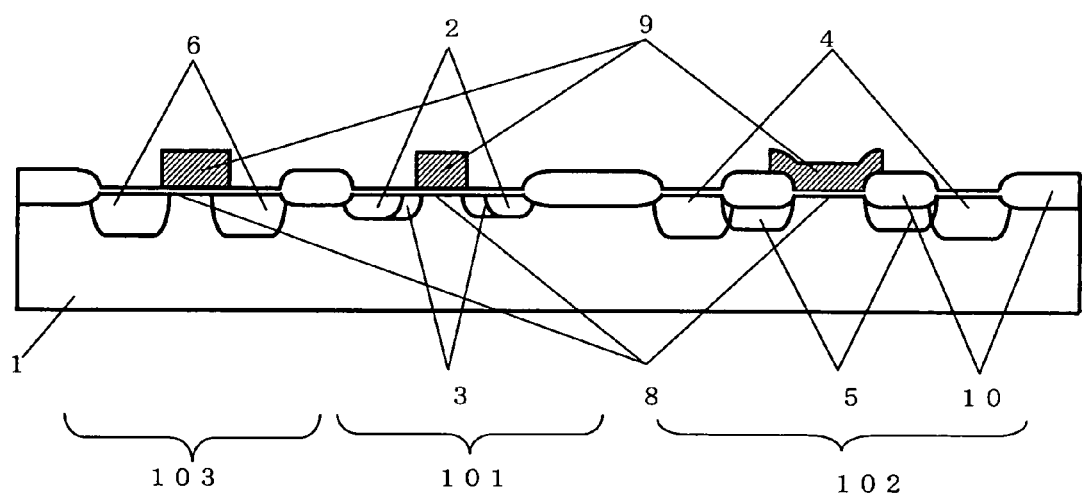
FIG. 4 is a schematic cross-sectional view showing another example of the semiconductor integrated circuit device according to the present invention.

As shown in FIG. 4, a second low-voltage NMOS 103, which includes the gate insulating film 8, the gate electrode 9, and third N-type high impurity concentration regions 6, is additionally integrated into the semiconductor integrated circuit device of FIG. 1. This element is not directly used for operating the semiconductor integrated circuit device, but is used for protecting the low-voltage NMOS 101 from an electrostatic thermal breakdown. Since it has been known that the deeper diffusion of the source/drain region of the low-voltage NMOS 103 can more effectively prevent the thermal breakdown, the high impurity concentration region is generally doped with atoms of, for example, phosphorus, which has a high diffusion coefficient. According to the present invention, the source/drain high impurity concentration region of low-voltage NMOS 103 is formed with the same step of forming the high impurity concentration region of the high-voltage NMOS 102, to thereby prevent the increase in the number of process steps.

As the second method, in forming the N-type high impurity concentration region of the high-voltage NMOS, the impurity is implanted with high energy so as to be implanted into a portion of the semiconductor substrate corresponding to the source/drain region of the high-voltage NMOS and also into another portion of the semiconductor substrate under the bird's beak formed on the thick oxide film contacting the source/drain region of the high-voltage NMOS. At this time, it is necessary to provide a mask to a region other than the source/drain region and the periphery thereof so as not to be doped with impurities.

Also, at the time of implanting ions as described above, an angle of the implantation may be adjusted so as to be tilted with respect to the semiconductor substrate such that the ions are sufficiently implanted into the semiconductor substrate under the bird's beak, to thereby make the present invention more effective.

As the third method, the N-type high impurity concentration region of the high-voltage NMOS is formed through a thermal diffusion process. This process makes it possible to form the impurity region in high concentration of $1 \times 10^{20}/cm^3$ or more, and also to increase the diffusion in a lateral direction in the following heat treatment process. The low-voltage NMOS 101 cannot adopt the thermal diffusion process of forming the high impurity concentration region, and therefore, the thermal diffusion process can be only adopted by the present invention in which the N-type high impurity concentration region of the low-voltage NMOS and the N-type high impurity concentration region of the high-voltage NMOS are separately formed.

With the above-mentioned methods, it is possible to realize a reliable semiconductor integrated circuit device capable of preventing a thermal destruction. According to the present invention, the semiconductor integrated circuit device can be realized with a reduced area necessary for the semiconductor integrated circuit through a smaller number of process steps, compared to the conventional device, thereby making it possible to reduce cost as well as the product TAT.

What is claimed is:

1. A semiconductor integrated circuit device, comprising:
   a semiconductor substrate;
   an N-channel low-voltage MOS transistor disposed on the semiconductor substrate having a first gate insulating film, a first gate electrode, and a first source/drain region formed of a first N-type high impurity concentration region and a first N-type low impurity concentration region for alleviating an electric field intensity, wherein the first N-type high impurity concentration region has an impurity concentration higher than that of the thirst N-type low impurity concentration region; and an N-channel high-voltage MOS transistor disposed on the semiconductor substrate having a second gate insulating film, a second gate electrode, a second source/drain region formed of a second N-type high impurity concentration region and a second N-type low impurity concentration region for alleviating an electric field intensity, and an insulating film formed on the second low impurity concentration region, the insulating film being thicker than the second gate insulating film, wherein the second N-type high impurity concentration region has an impurity concentration higher than that of the second N-type low impurity concentration region, wherein the first N-type high impurity concentration region is doped with a first impurity and the second N-type high impurity concentration region is doped with a second impurity whose diffusion coefficient is larger than that of the first impurity wherein in the N-channel high-voltage MOS transistor, the second N-type high impurity concentration region and the second N-type low impurity concentration region at least partially overlap with each other at a depth deeper than the thick insulating film.

2. A semiconductor integrated circuit device according to claim 1, wherein:
the first N-type high impurity concentration region is doped with arsenic; and
the second N-type high impurity concentration region is doped with phosphorus.

3. A semiconductor integrated circuit device according to claim 1, wherein:
the first N-type high impurity concentration region is doped with antimony; and
the second N-type high impurity concentration region is doped with phosphorus.

4. A semiconductor integrated circuit device according to claim 1, wherein in the N-channel high-voltage MOS transistor, the second gate insulating film and the thick insulating film are continuously formed.

5. A semiconductor integrated circuit device according to claim 1, wherein in the N-channel high-voltage MOS transistor, the second gate insulating film and the thick insulating film are continuously formed.

6. A semiconductor integrated circuit device according to claim 1, wherein in the N-channel high-voltage MOS transistor, the second gate electrode at least partially overlaps the thick insulating film.

7. A semiconductor integrated circuit device, comprising:
a first N-channel low-voltage MOS transistor;
an N-channel high-voltage MOS transistor; and
a second N-channel low-voltage MOS transistor, which are formed on a semiconductor substrate,
the first N-channel low-voltage MOS transistor comprising:
a first gate insulating film;
a first gate electrode; and
a first source/drain region formed of a first N-type high impurity concentration region and a first N-type low impurity concentration region for alleviating an electric field intensity, wherein the first N-type high impurity concentration region has an impurity concentration higher than that of the thirst N-type low impurity concentration region, the N-channel high-voltage MOS transistor comprising:
a second gate insulating film;
a second gate electrode;
a second source/drain region formed of a second N-type high impurity concentration region and a second N-type low impurity concentration region for alleviating an electric field intensity, wherein the second N-type high impurity concentration region has an impurity concentration higher than that of the second N-type low impurity concentration region; and
an insulating film formed on the second low impurity concentration region, the insulating film being thicker than the second gate insulating film, wherein the first N-type high impurity concentration region is doped with a first impurity and the second N-type high impurity concentration region is doped with a second impurity whose diffusion coefficient is larger than that of the first impurity, and the second N-channel low-voltage MOS transistor comprising:
a third gate insulating film;
a third gate electrode; and
a third N-type high impurity concentration region, wherein the third N-type high impurity concentration region is doped with the second impurity wherein in the N-channel high-voltage MOS transistor, the second N-type high impurity concentration region and the second N-type low impurity concentration region at least partially overlap with each other at a depth deeper than the thick insulating film.

8. A semiconductor integrated circuit device according to claim 7, wherein:
the first N-type high impurity concentration region is doped with arsenic; and
the second N-type high impurity concentration region and the third N-type high impurity concentration region are each doped with phosphorus.

9. A semiconductor integrated circuit device according to claim 7, wherein:
the first N-type high impurity concentration region is doped with antimony; and
the second N-type high impurity concentration region and the third N-type high impurity concentration region are each doped with phosphorus.

10. A semiconductor integrated circuit device according to claim 7, wherein:
the second N-type high impurity concentration region has an impurity concentration of $1 \times 10^{19}/cm^3$ or more and has a depth of 0.5 μm or more; and
the second N-type low impurity concentration region has an impurity concentration between $1 \times 10^{17}$ to $5 \times 10^{17}$ $cm^3$ and has a depth of 0.3 μm or less.

11. A semiconductor integrated circuit device according to claim 7, wherein the first N-type high impurity concentration region and the second N-type low impurity concentration region contact over an area at a depth of 0.2 μm or more.

12. A semiconductor integrated circuit device according to claim 7, wherein in the N-channel high-voltage MOS transistor, the second gate electrode at least partially overlaps the thick insulating film.

* * * * *